United States Patent [19]
Choi

[11] Patent Number: 6,044,008
[45] Date of Patent: Mar. 28, 2000

[54] FERROELECTRIC RAM DEVICE

[75] Inventor: Ja Moon Choi, Seoul, Rep. of Korea

[73] Assignee: Hyundai Electronics Industries Co., Ltd., Kyungki-Do, Rep. of Korea

[21] Appl. No.: 09/100,178

[22] Filed: Jun. 18, 1998

[30] Foreign Application Priority Data

Jun. 20, 1997 [KR] Rep. of Korea ................. 97-26328

[51] Int. Cl.[7] ............................................... G11C 11/22
[52] U.S. Cl. .......................................... 365/145; 365/149
[58] Field of Search ..................... 365/145, 149

[56] References Cited

U.S. PATENT DOCUMENTS 5,572,459  11/1996  Wilson et al. ................. 365/145
5,715,190  2/1998  Honjo et al. ................... 365/149
5,726,930  3/1998  Hasegawa et al. .............. 365/145

*Primary Examiner*—David Nelms
*Assistant Examiner*—M. Tran
*Attorney, Agent, or Firm*—Cohen, Pontani, Lieberman & Pavane

[57] ABSTRACT

The present invention relates to a ferroelectric RAM device to solve the problem that, in case of using one reference voltage generator to bit lines in which a plurality of memory cells are arranged, electric charge is decreased according to the increase in the number of use of reference cell and the reference voltage is changed, resulting in it is difficult to secure the sensing margin.

4 Claims, 13 Drawing Sheets

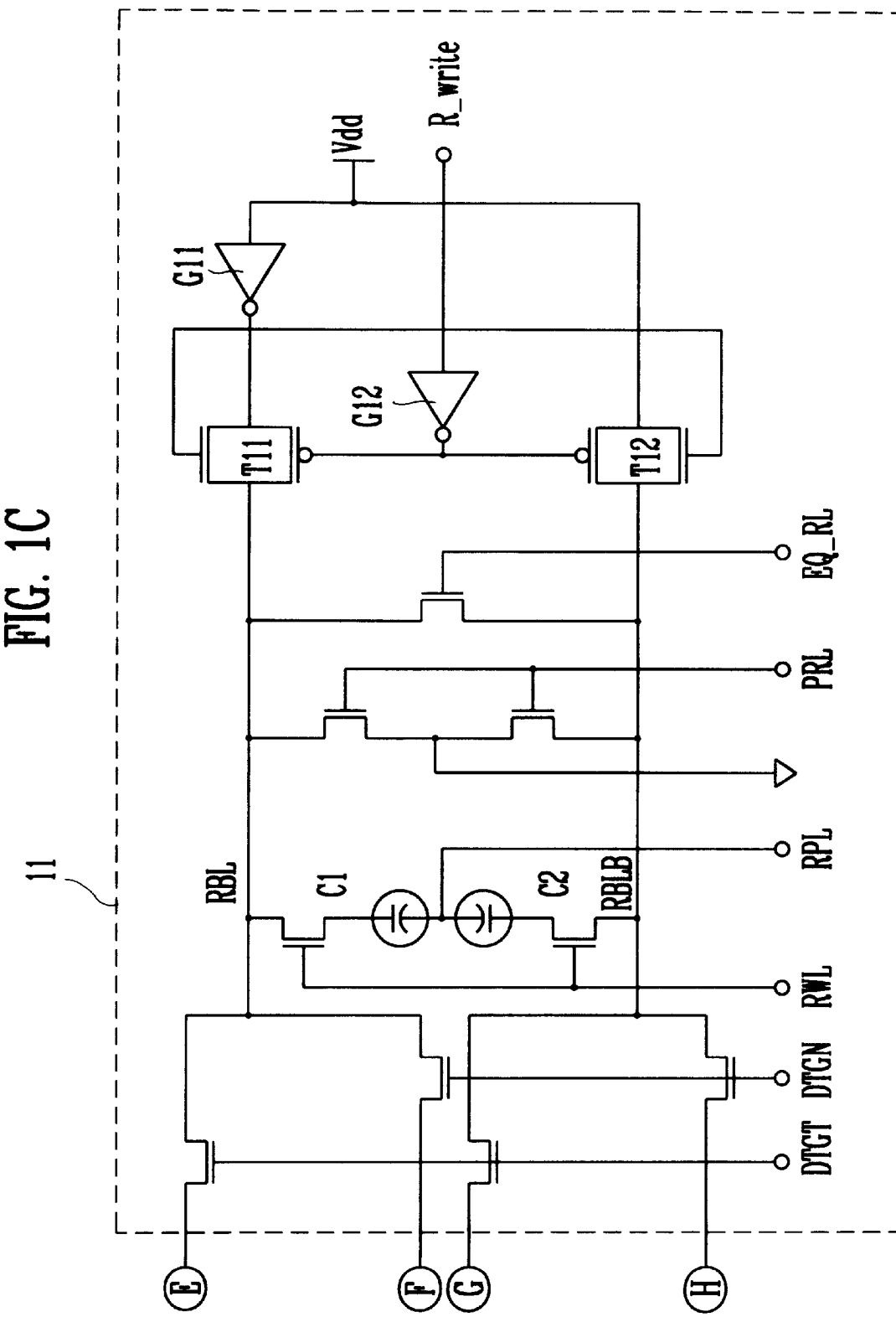

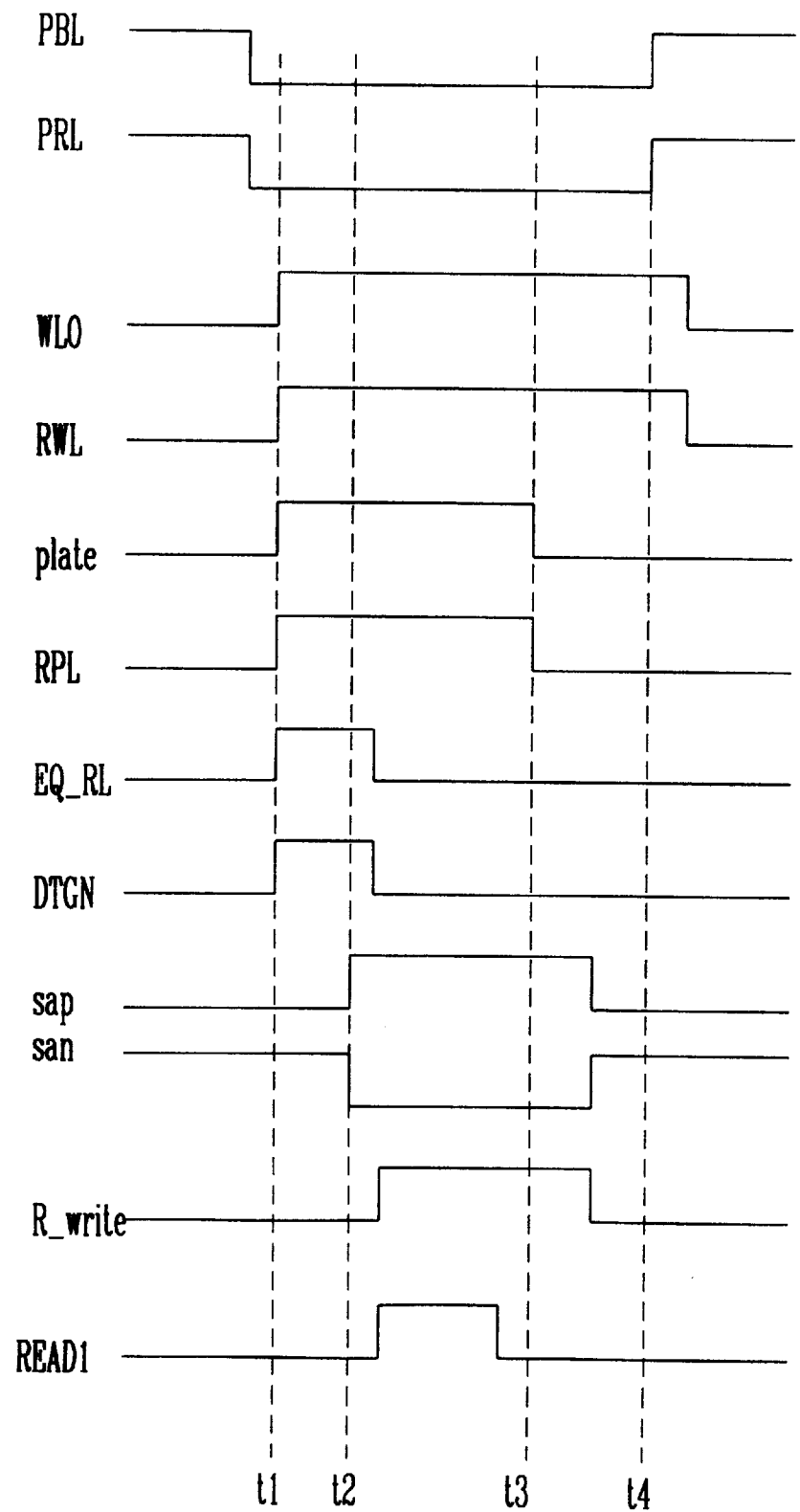

| A2 | A1 | A0 | WLn |
|---|---|---|---|
| 0 | 0 | 0 | WL0 |
| 0 | 0 | 1 | WL1 |
| 0 | 1 | 0 | WL2 |
| 0 | 1 | 1 | WL3 |
| 1 | 0 | 0 | WL4 |
| 1 | 0 | 1 | WL5 |
| 1 | 1 | 0 | WL6 |
| 1 | 1 | 1 | WL7 |

FIG. 5A
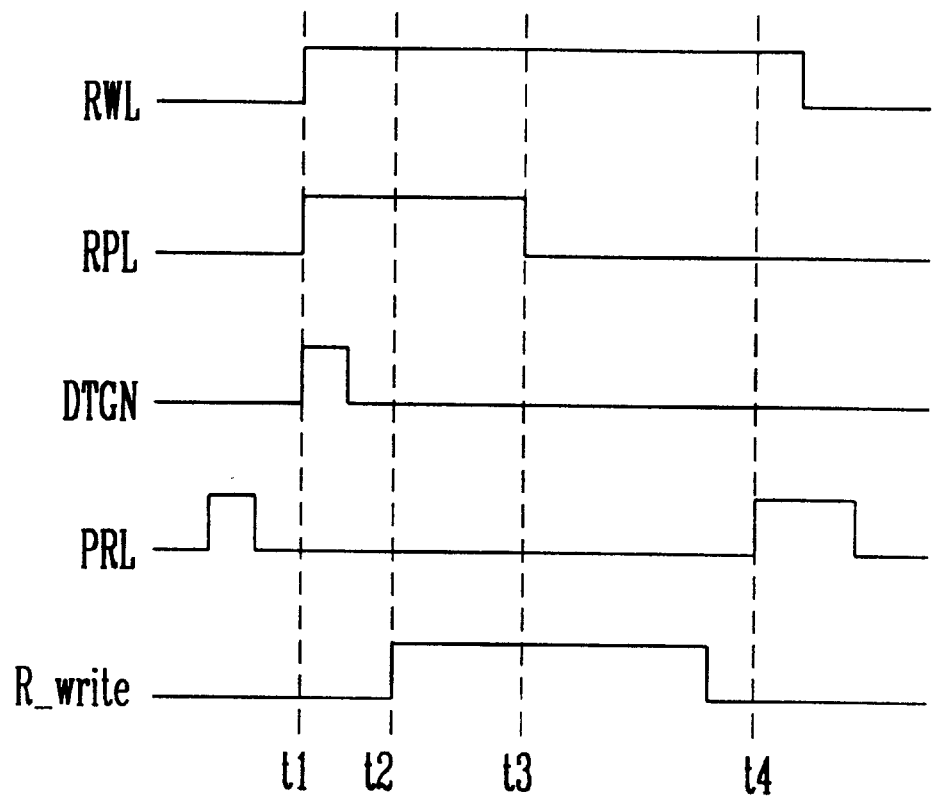
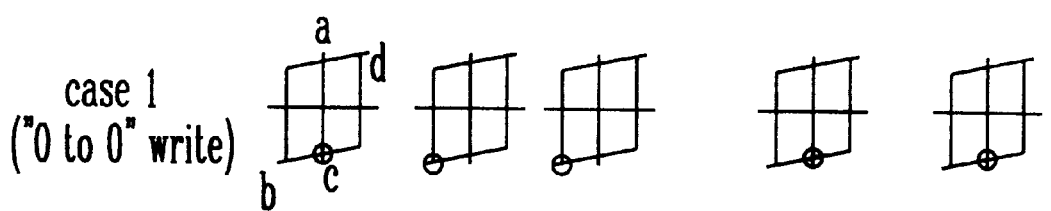

FIG. 6B
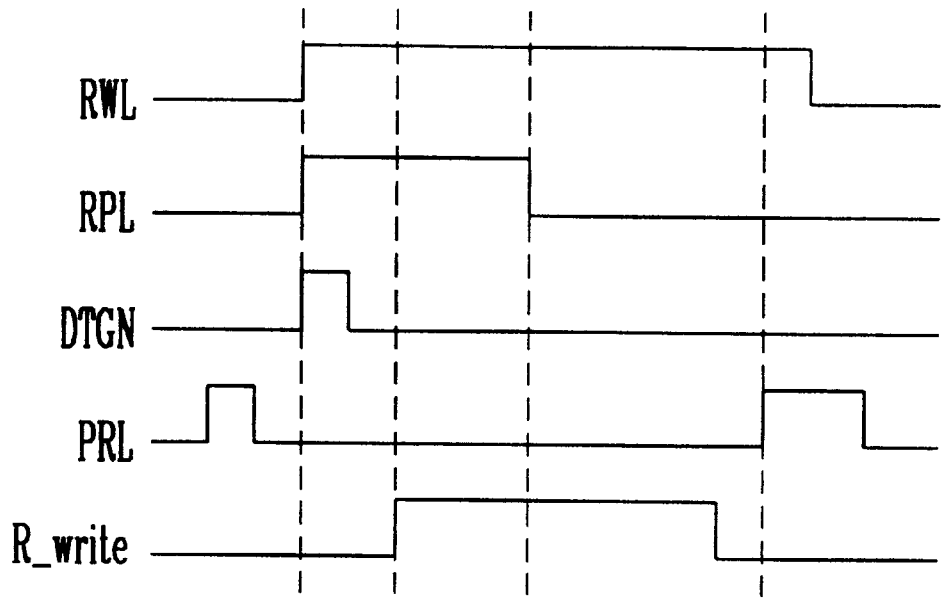
case 2 ("1 to 1" write)
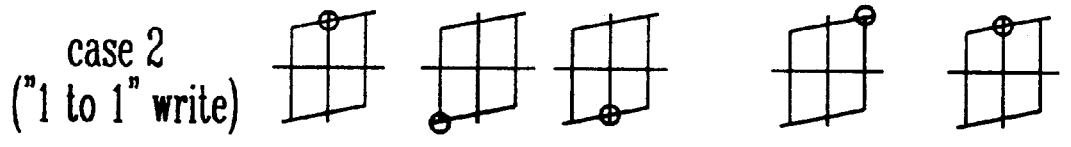
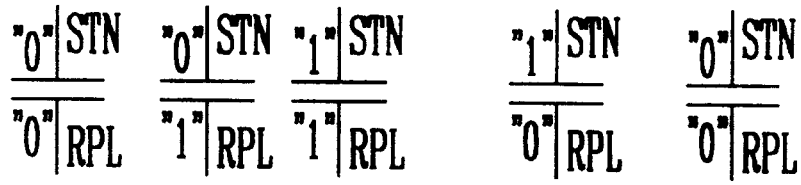
case 4 ("1 to 0" write)
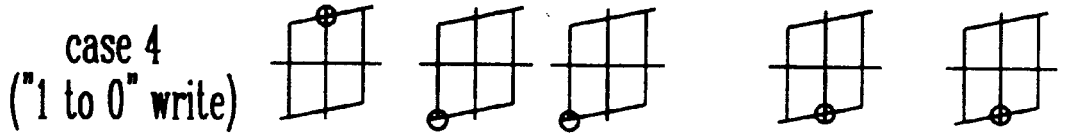
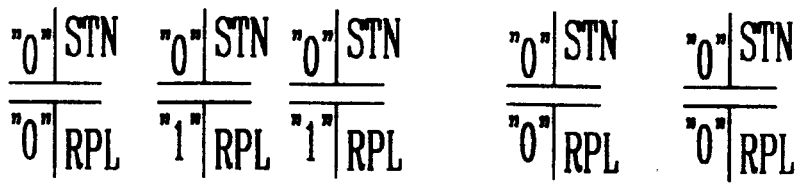

FERROELECTRIC RAM DEVICE

BACKGROUND OF THE INVENTION

1. Field of the Invention

The present invention relates to a ferroelectric random access memory (RAM) device.

2. Description of the Prior Arts

In general, a procedure of reading an information stored in the ferroelectric RAM device is as follows. First, if a word line is selected, a bit line has voltage of V0 or V1, which are different from each other, according to an information of 0 or 1 stored in the memory cell. Since the voltage V0 or V1 of the bit lines is small, it must be amplified by means of a sense amplifier. To amplify the voltage V0 or V1 of the bit lines, a reference voltage Vref having a value between V0 and V1 and applied to one bit line is necessary.

That is, information of the cell is sensed by comparing the reference voltage Vref applied to the bit line with the voltage V0 or V1 of other bit line by means of the sense amplifier. As a result, it is possible to sense whether the information of the cell is 0 or 1. Also, the sensing margin is required to compare the reference voltage Vref and the voltage of the bit line, and the sensing margin is varied according to an electric charge of the reference cell used in a reference voltage generator.

However, in the prior art, since information of 0 and 1 are fixedly stored in two reference cells, respectively, the number of using the reference cell is more increased than the number of using the memory cell so that the electric charge of the reference cell is lower than that of the memory cell. The decrease of the electric charge brings about the change in the voltage and has a problem in that the securance of sensing margin is difficult.

Details of the prior art will be described with reference to FIG. 1A, FIG. 1B and FIG. 1C.

FIG. 1A through FIG. 1C are circuit diagrams illustrating a prior art ferroelectric memory device. The procedure of fixedly storing an information of 0 and 1 in reference cells C1 and C2 of a reference voltage generating circuit 11 is as follows.

When a reference word line RWL is selected and potential of a reference write terminal R-write becomes a high level, a first transfer gate T11 and a second transfer gate T12 are turned on by the potential of the reference write terminal R-write and an output of a second inverter G12. Accordingly, voltage Vdd is inverted by a first inverter G11 and then is applied to a reference bit line RBL through the first transfer gate T11, and the voltage Vdd is also applied to a reference bit line bar RBLB through the second transfer gate T12 as shown in FIG. 1C.

As a result, a voltage of low state is applied to the first reference cell C1 through the first transfer gate T11 so that an information of 0 is stored in the first reference cell C1. Also, a voltage of high state is applied to the second reference cell C2 through the second transfer gate T12 so that an information of 1 is stored in the second reference cell C2.

The procedure of reading the information stored in the ferroelectric memory is described below.

As shown in FIG. 1B, if a word line WL0 becomes a high state by a decoder 14, transistors Q11 and Q12 are turned on (assuming that the information of 0 is stored in a memory cell C11 and the information of 1 is stored in a memory cell C12 among a memory cell array 12). A precharge bit line PBL of FIG. 1A becomes a high state, bit lines BL0, BL0_bar, BL1 and BL1_bar are grounded. Also, a precharge reference line PRL of FIG. 1C becomes high state, reference bit lines RBL and RBLB are grounded.

Electric charges stored in the memory cells C11 and C12 are transferred to the bit lines BL0 and BL1 according to a signal applied to a word line WL0 and a signal applied to a plate terminal. In addition, the information of 0 and 1 fixedly stored in the first and second reference cells C1 and C2 of the reference voltage generation circuit 11, respectively are transferred to the reference bit lines RBL and RBLB by applying a signal having a high level to the reference word line RWL and reference plate line RPL. An equalization reference line EQ_RL becomes high state so that the reference bit lines RBL and RBLB are equalized. The equalized voltages are transferred to the bit lines BL0_bar and BL1_bar according to a high state signal applied to a terminal DTGN. Voltage transferred to the bit lines BL0_bar and BL1_bar have an intermediate value between the voltages of the bit lines BL0 and BL1. That is, since the information of 0 is stored in the cell C11, the bit line BL0 has a voltage which is lower than a voltage of the bit line BL0_bar, also since the information of 1 is stored in the cell C12, the bit line BL1 has a voltage which is higher than a voltage of the bit line BL1_bar.

The difference between the two voltages is sensed by a sense amplifier 13 when potential of a terminal read 1 becomes a high state after Vdd is applied to a terminal sap and a terminal san is grounded. Data of a low level is transferred to a terminal data 0 and data of a high level is transferred to a terminal data 1 and they are sent to an output buffer. To restore the original value before the reading out operation to the memory cells, the terminals read 1, plate, sap and san become a low level. Thereafter, if the reference bit lines RBL and RBLB are grounded by applying a high state to the precharge reference line PRL, the potential of reference word line RWL and the word line WL0 are transformed into a low state, then one cycle for reading out the information stored in the memory cells is completed.

The restoring operation of the reference cells is as follows.

Data before reading, that is, 0 and 1 are stored in the cells C1 and C2 by means of a signal applied to the reference write terminal Write R_write. Then signals applied to the terminals RPL and R_write are transformed into low state. Then, if the reference bit line RBL is to be ground by applying a high state signal to the precharge reference line PRL and the potential of reference word line RWL is transformed into a low state, then one cycle of the operation of the reference cells is completed.

However, since one reference voltage generation circuit 11 is used on one bit line to which a plurality of memory cells are arrayed in the prior art, the number of using the reference cell is increased by the number of memory cell arrays 12. That is, since 0 and 1 are fixedly stored in two reference cells C1, C2, the amount of electric charge is decreased according to the increase in the number of using the reference cell and it is difficult to secure the sensing margin according to the change in reference voltage, whereby the reliability in the device is degraded.

SUMMARY OF THE INVENTION

Therefore, the object of the invention is to provide a ferroelectric RAM device in which an information of 0 and 1 can be alternatingly stored in two reference cells according to the change of an address signal used for selecting a word line of the memory cell array. According to the invention, the decrease of electric charge in the reference cell can be prevented and the life time can be extended so that reliability can be increased.

To accomplish the object described above, the ferroelectric RAM device of the present invention comprises a cell array consisting of a plurality of memory cells disposed in matrix between a plurality of word lines and bit lines, a decoder for selecting the word line in response to a plurality of address inputs, a reference voltage generating circuit for outputting a reference voltage according to an address signal outputted from the decoder, and a sense amp circuit connected to the bit line and to which a data stored in the memory cell which is selected by the decoder and output voltage of the reference voltage generating circuit are input, respectively.

BRIEF DESCRIPTION OF THE DRAWINGS

For fuller understanding of the nature and objects of the present invention, reference should be had to the following detailed description taken in conjunction with the accompanying drawings in which:

FIG. 1A through FIG. 1C are circuit diagrams illustrating a prior art ferroelectric memory device;

FIG. 3 is a timing diagram of each pulse for driving a memory cell and a reference cell;

FIGS. 5A and 5B are state diagrams of hysterisis curve for a prior art reference voltage generating circuit;

FIGS. 6A and 6B are state diagrams of hysterisis curve for a reference voltage generating circuit according to the present invention.

DETAILED DESCRIPTION OF THE INVENTION

A detailed description of the present invention will be given below with reference to the accompanying drawings.

Figure 1A:
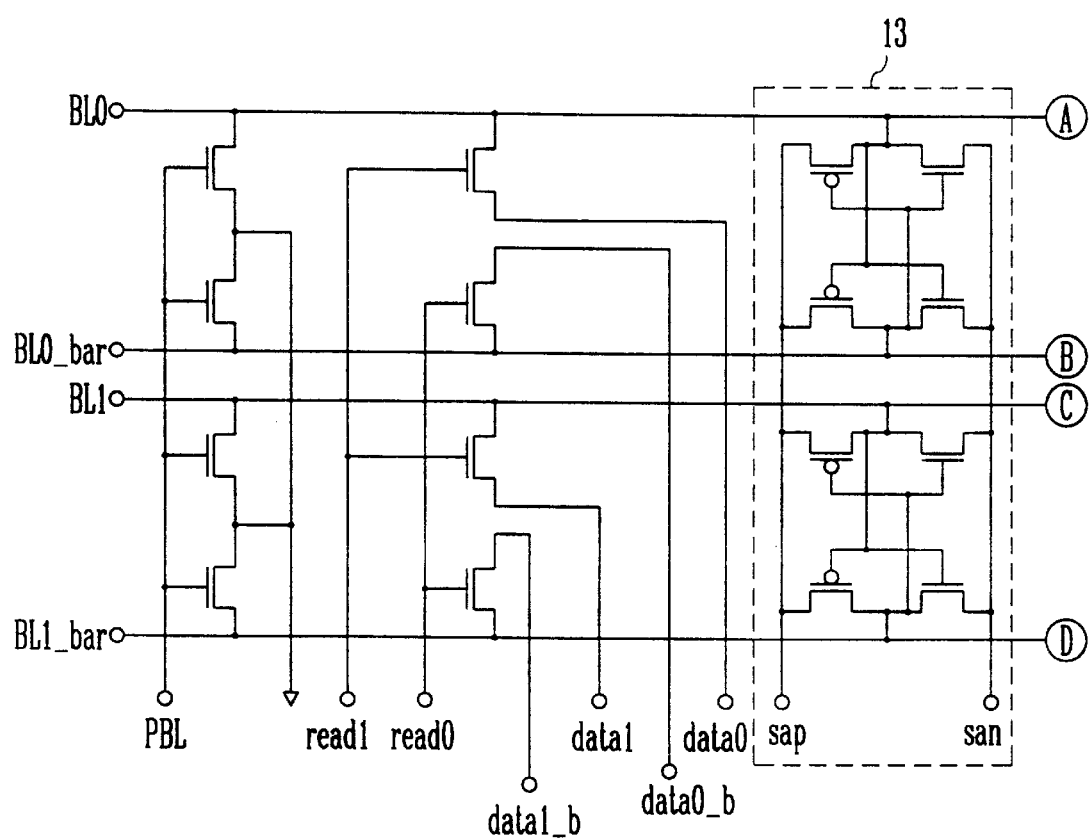
Figure 1B:
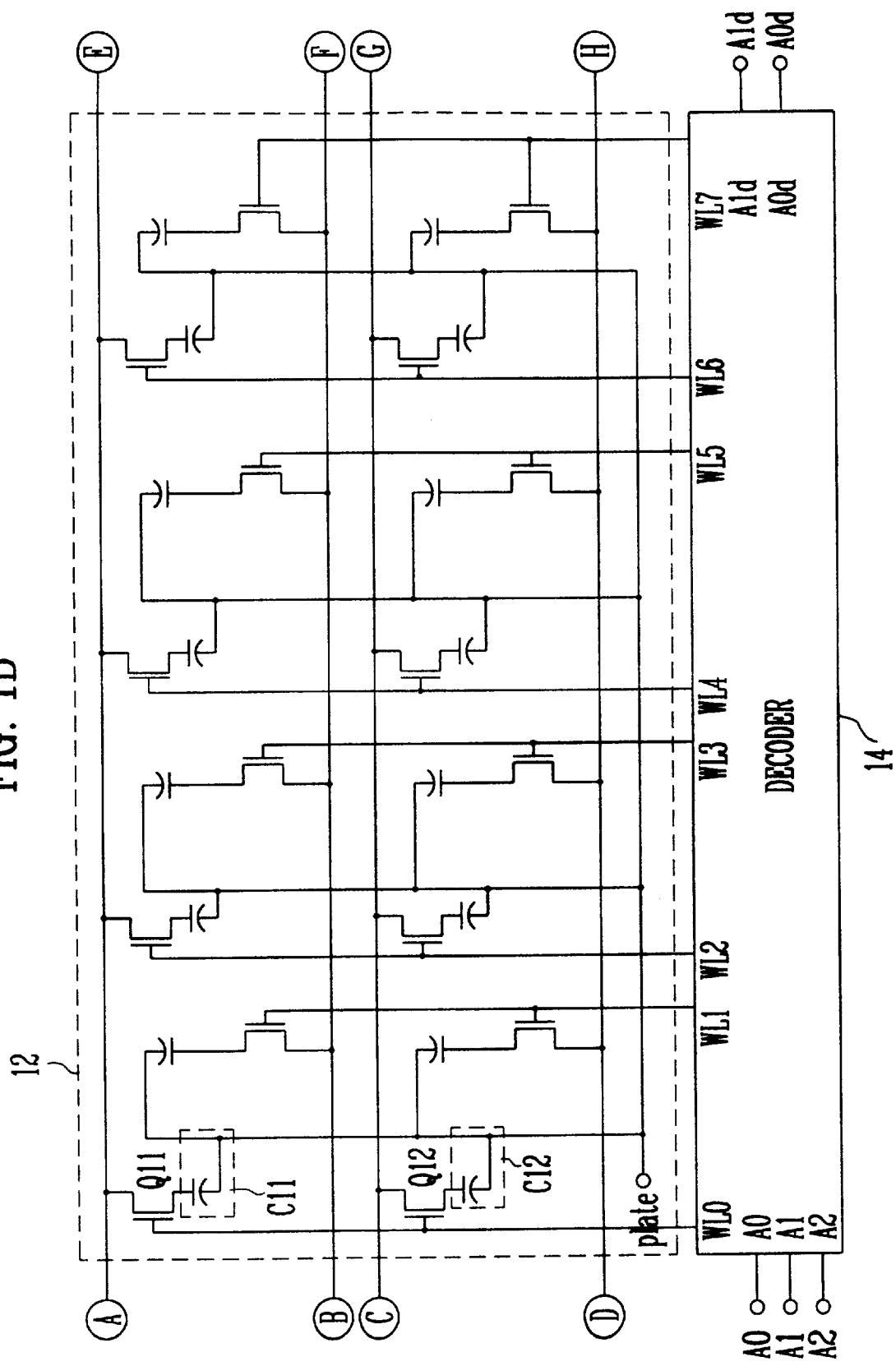
Figure 2A:
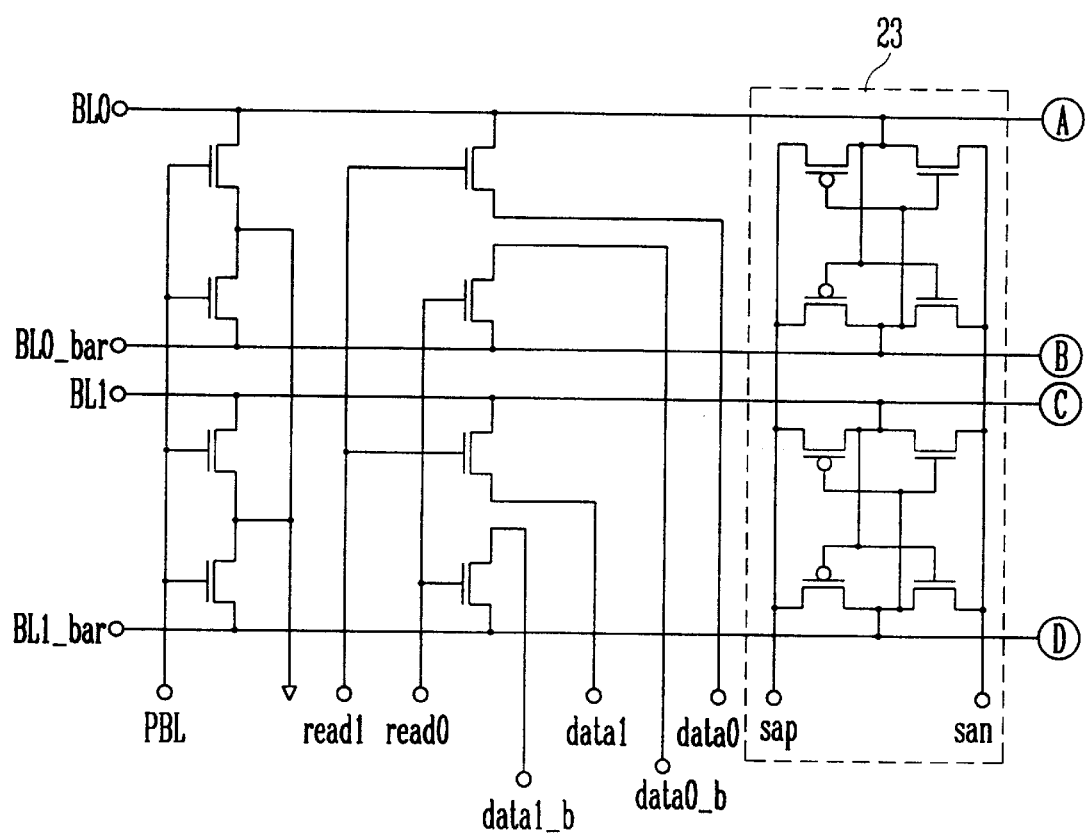
FIG. 2A through FIGS. 2C are circuit diagrams illustrating a ferroelectric memory device of the present invention.
Figure 2B:
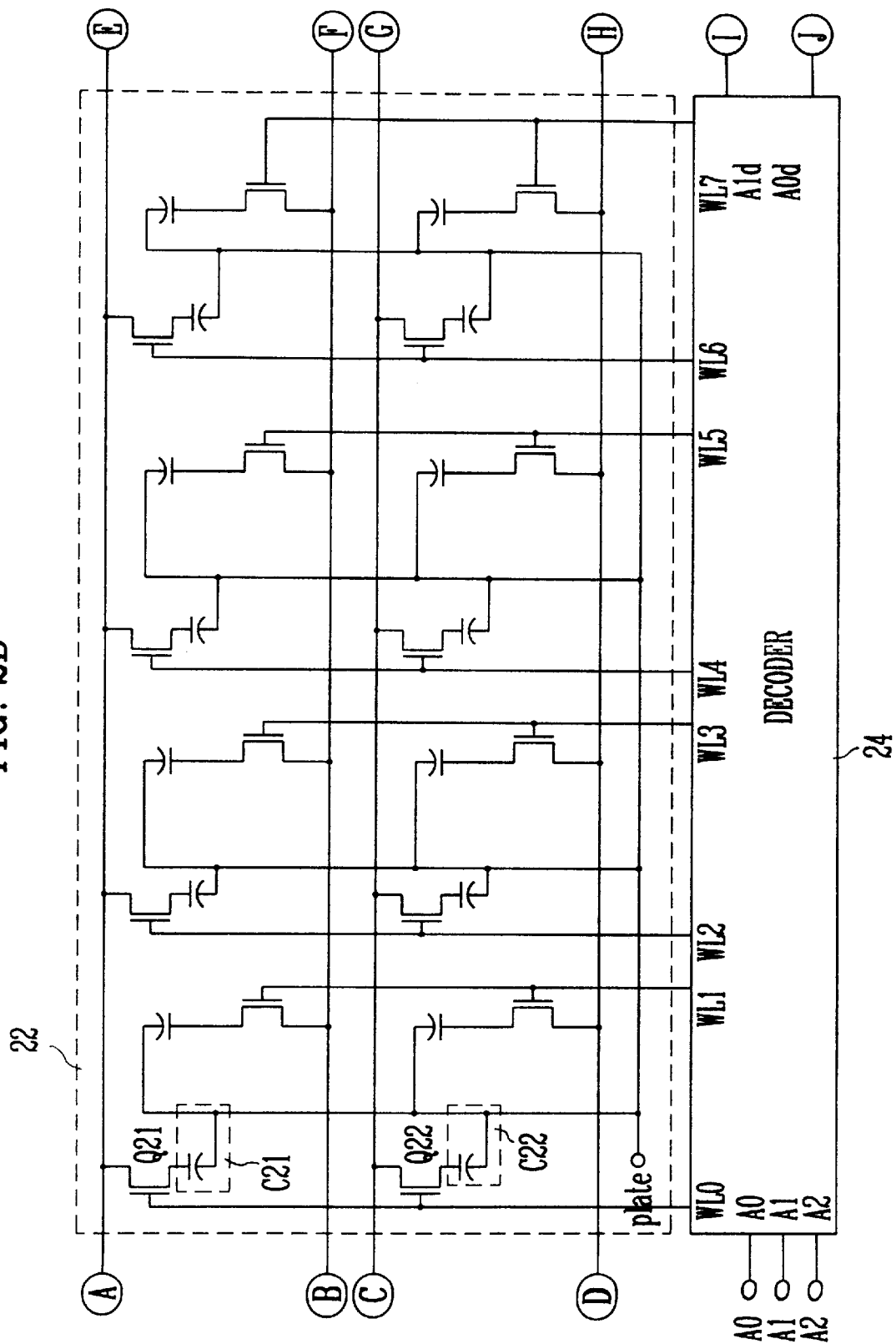
Figure 2C:
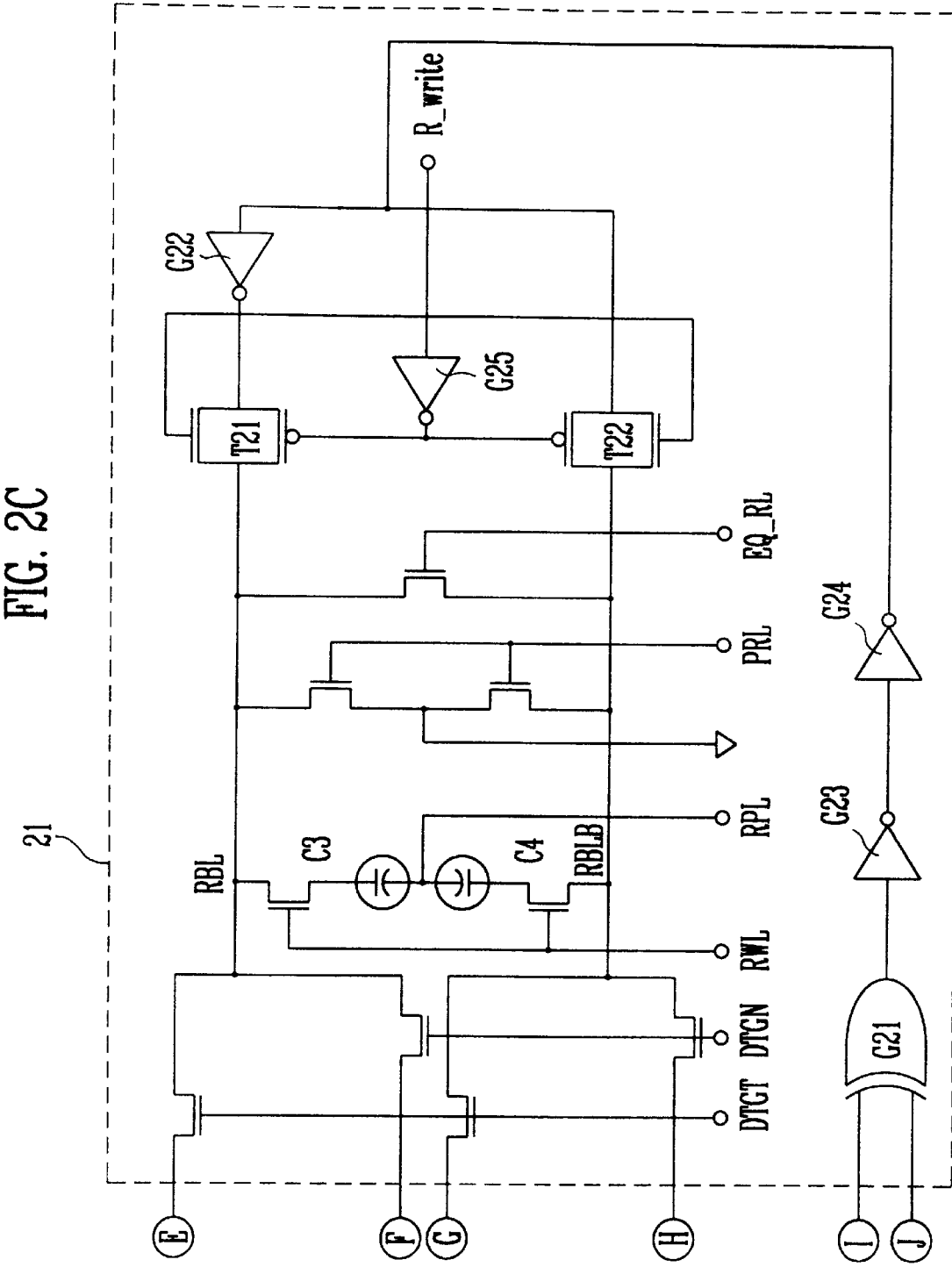

FIGS. 2A through 2C are circuit diagrams illustrating a ferroelectric memory device according to the present invention and FIG. 3 is a timing diagram of each pulse for driving a memory cell and a reference cell.

If the least significant two bits among a plurality of address signals are inputted to an exclusive OR gate (EXOR gate) G21 through a decoder 22, an output of the EXOR gate G21 is logical 0 in case where two address signals are same, and an output of the EXOR gate G21 is logical 1 in case where two address signals are different from each other. The output of the EXOR gate G21 is used as input voltage of first and second transfer gates T21 and T22. That is, the output of the EXBR gate G21 is inverted through inverters G23, G24 and G22 and then applied to the first transfer gate T21 as an input. And, the output of the EXOR gate G21 is applied to the second transfer gate T22 through the inverters G23 and G24. A reference_write signal R_write of FIG. 3 is applied to each gate electrode for a NMOS transistor of transfer gates T21, T22. Also, the reference_wrtie signal R_write is inverted by an inverter G25 and then is applied to each gate electrode for a PMOS transistor of the transfer gates T21, T22. As the reference_write signal R_write becomes a high state, logical 1 is stored in a first reference cell C3 and logical 0 is stored in second reference cell C4 in case where two address signals are same, while logical 0 is stored in the first reference cell C3 and logical 1 is stored in the second reference cell C4 in case where two signals are different from each other.

The process of reading information stored in ferroelectric memory by a reference voltage generated by the electric charge of reference cell is described as follows with reference to the timing diagram of FIG. 3.

A word line signal WL0 becomes a high state by the decoder 24 so that a first and second transistors Q21 and Q22 are turned on and a first and second memory cells C21 and C22 are selected. Hereinafter, an example is illustrated in which logical 0 is stored in the first memory cell C21 and logical 1 is stored in the second memory cell C22.

First, when a precharge bit ling signal PBL becomes a high state, a bit line in standby state is grounded. A precharge reference bit line signal PRL becomes a high state, whereby reference bit lines RBL and RBLB are grounded. Thereafter, at time tl in FIG. 3, if the word line signal WL0 is a high state and a signal having a high state is applied to a plate terminal plate, the electric charges are sent to bit lines BL0 and BL1 according to information stored in the cells. The reference word line signal RWL and the reference plate line signal RPL become a high state so that the information stored in the first and second reference cells C3 and C4 of the reference voltage generation circuit 21 are sent to the reference bit lines RBL and RBLB. The information stored in the first and second reference cells C3 and C4 may be changed according to the least significant two bits of addresses passed through the decoder 24 as described above.

Then the voltages of the reference bit lines RBL and RBLB are transferred and equalized by an equalize-reference line signal EQ_RL having a high state. The equalized voltage of the reference bit lines RBL and RBLB are transferred to the bit lines BL0_bar and BL1_bar by a signal DTGN. The voltage transferred to the bit lines BL0_bar and BL1_bar becomes to have an intermediate value between the bit line voltages according to information stored in the memory cells. That is, since logical 0 is stored in the first memory cell C21, the bit line BL0 has a lower voltage than a voltage of the bit line BL0_bar, and since logical 1 is stored in the second memory cell C22, the bit line BL1 has higher voltage than a voltage of the bit line BL1_bar.

Then, at time t2 of FIG. 3, if the difference between the two voltages is amplified by the sense amplifier 23, in which Vdd is applied to a terminal sap and a terminal san is grounded. If a signal read 1 becomes a high state, a data having logical 0 is sent to a data line data 0 and a data having logical 1 is sent to a data line data 1 and they are sent to output buffer. To restore the original value before reading to the memory cell after the signal read1 becomes a low state, at time t3 of FIG. 3, to the terminal plate a signal of low state is input and potential of the terminals sap and san are transformed into a low state. Thereafter, at time t4 of FIG. 3, if the reference bit line RBL is to be ground by transforming the precharge reference line PRL into a high state, potential of the reference word line RWL and the word line signal WL0 are transformed into a low state, then one cycle for reading the information stored in the memory cell is completed.

The restoring operation of the reference cell is as follows. The data stored in the reference cells C3 and C4 are determined by the output of the EXOR gate to which the least significant two bit signals are input according to which address the word line WL selected at t1 of FIG. 3, and if reference_write signal R_write is transformed into a high state, then data are stored in the reference cells C3 and C4 through the transfer gates T21, T22. Then, at time t3 of FIG. 3, potential of the reference plate line RPL and the reference_write signal R_write are transformed into a low state. Then at time t4 of FIG. 3, if the reference bit line RBL is to be ground by transforming the precharge reference line PRL into a high state and potential of the reference Word Line RWL is transformed into a low state, then one cycle of the operation of reference cell is completed.

Figures 4A, 4B:
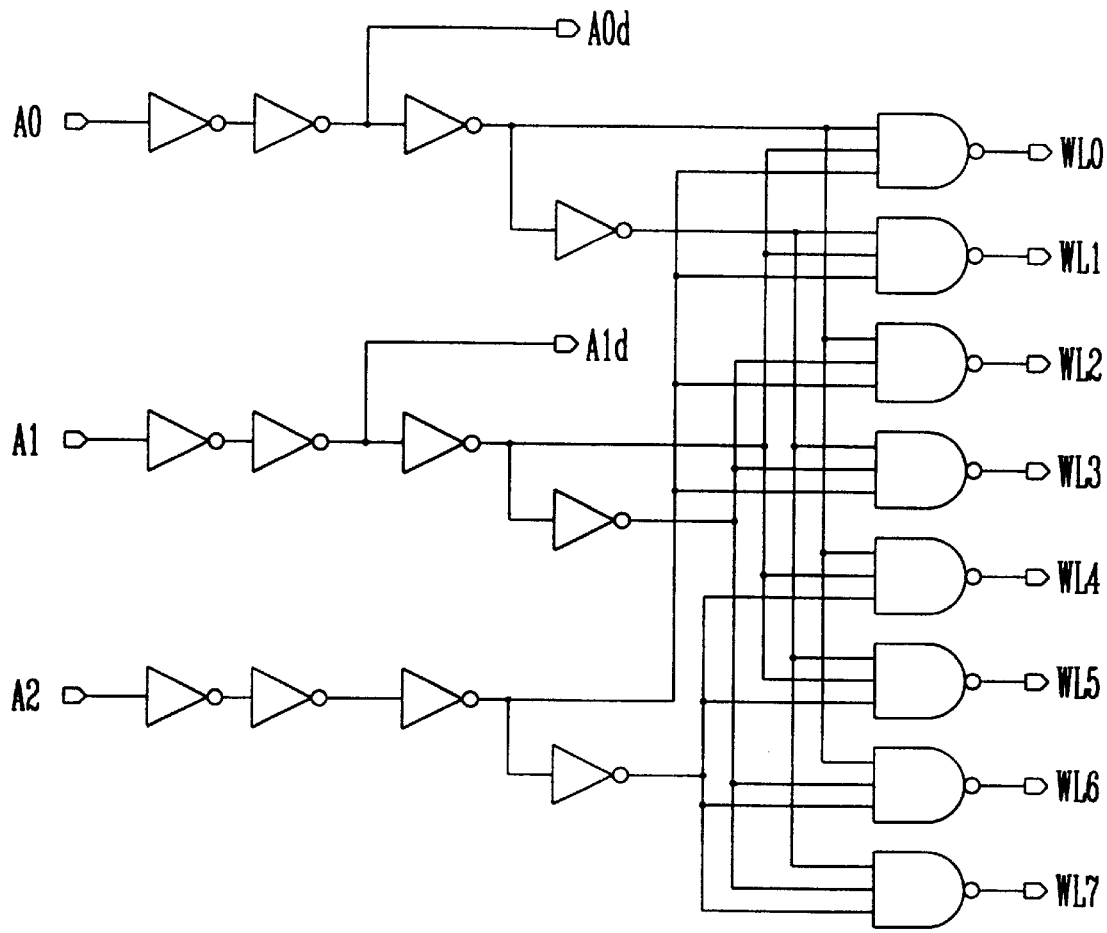
FIGS. 4A and 4B are schematic drawing and truth table, respectively, of the decoder shown in FIG. 2A.

FIGS. 4A and 4B are schematic drawing and truth table of the decoder shown in FIG. 2A. Even in case where there are various address signals inputted through the decoder, the number of cases where the input signals are same for the two least significant bits and the number of cases where the input signals are different for the two least significant bits are same. Therefore, for the information stored in the reference cell through output of 2-input EXOR gate, logical 0 and 1 are stored in the same number of times for both reference cells C3 and C4.

The following table is a truth table of reference cell according to the present invention. Remaining signals excluding two least significant bits among the inputted address signals are considered as don't care term, and the cases where the input signals are same for the two least significant bits and the cases where the input signals are different occur in the same number of times. In addition, it can be seen that logical 1 is stored in the reference cell C3 and logical 0 is stored in the reference cell C4 in case where the two input signals are same and that logical 0 is stored in the reference cell C3 and logical 1 is stored in the reference cell C4 in case where the two input signals are different.

TABLE

| A2 | A1 | A0 | C3 | C4 |
|----|----|----|----|----|
| 0 | 0 | 0 | 1 | 0 |
| 0 | 0 | 1 | 0 | 1 |
| 0 | 1 | 0 | 0 | 1 |
| 0 | 1 | 1 | 1 | 0 |
| 1 | 0 | 0 | 1 | 0 |
| 1 | 0 | 1 | 0 | 1 |
| 1 | 1 | 0 | 0 | 1 |
| 1 | 1 | 1 | 1 | 0 |

Figure 5B:
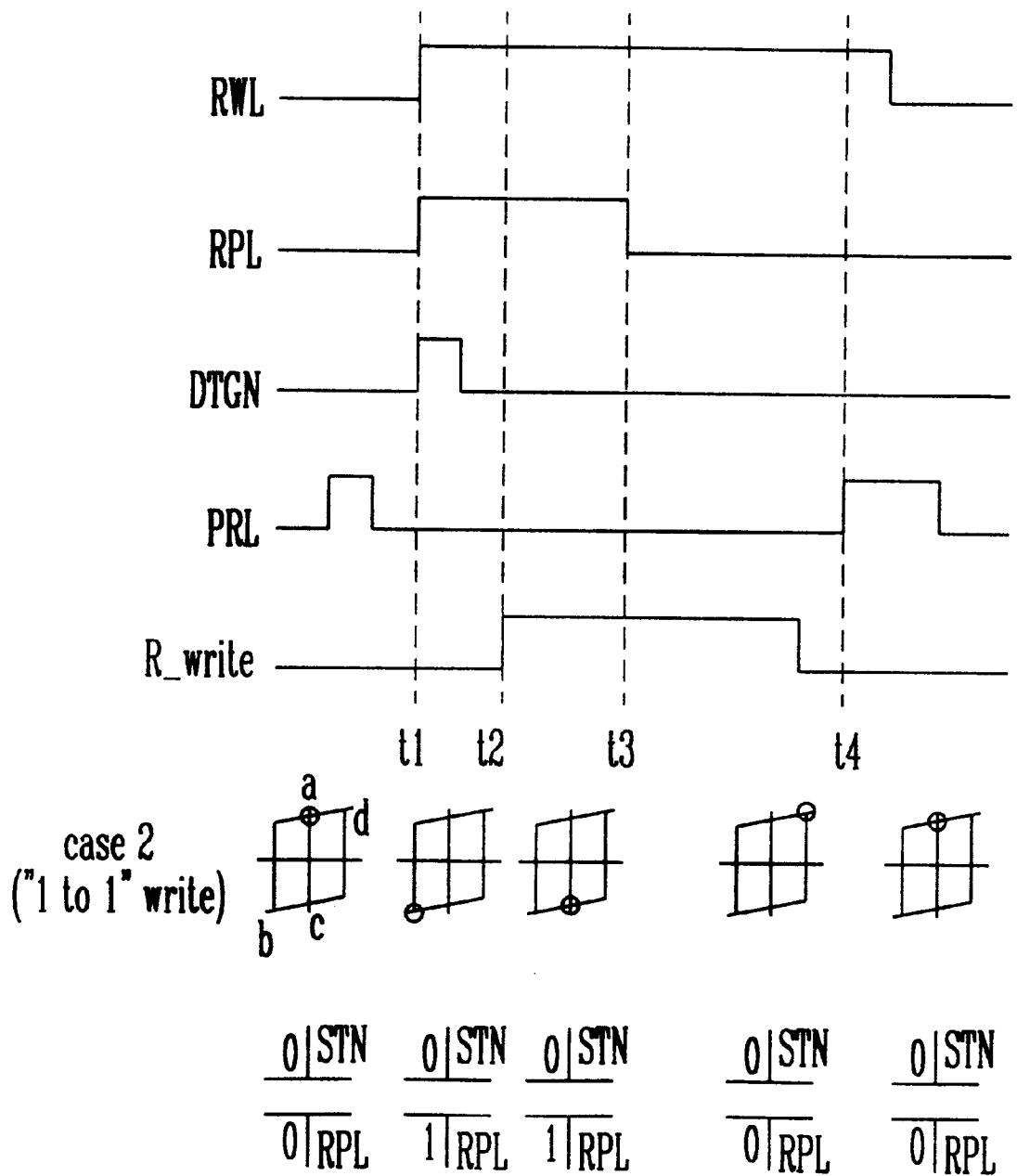

FIGS. 5A and 5B are state diagram of tysterisis curve of prior art reference voltage generation circuit. The potentials applied to the two ends of ferroelectric material are indicated below hysterisis curve, and there are two nodes of the reference plate line RPL and a storage node STN at the two ends of ferroelectric material. Here, value 0 means logic low and value 1 means logic high. First, in case where 0 is always stored in reference cell as shown in FIG. 5A, the initial polarization state is situated at point c. If, at time t1, potential of the reference word line RWL and the reference plate line RPL are transformed into a high state, the polarization state of the ferroelectric material is moved from c to b and maintains till time t3. At time t3, if potential of the reference plate line RPL is transformed into a low state, the voltages at the two ends of ferroelectric material each become 0V so that the polarization state is again moved to point c. Thereafter, at time t4, even if potential of the reference word line RWL maintains a high state and potential of the precharge reference line PRL is transformed into a high state to make the potential of the reference bit line RBL 0V, the polarization state of ferroelectric material is maintained of point c. As described above, at the time of reading/writing of information stored in ferroelectric memory device, the reference C1 which stores 0 repeats only c→b→c state, and the reduction in electric charge of cell according to the number of use does not almost occur.

Next, in case where 1 is always stored in reference cell as shown in FIG. 5B, the initial polarization state is situated at point a. If, at time t1, potential of the reference word line RWL and the reference plate line RPL are transformed into a high state, the polarzation state is moved to point b and maintains till time t2. At time t2, if the reference_write signal R_write is transformed into a high state so that high voltage is applied to the storage node STN, then the polarization state is situated at point c. Then, at time t3, if the potential of the reference plate line RPL is transformed into a low state and the signal R_write is maintained a at high state, the polarization state is situated at point d. At time t4, if potential of the reference bit line RBL becomes 0V by means of the signal R_write and the potential of the reference plate line RPL, the polarization state returns again to point a and 1 is stored. As described above, since the cell C2 which stores 1 repeats a→b→c→d a state every time it is read or written, the reduction in electric charge easily occurs when compared to C1, and it is difficult to secure the sensing margin according to the increase in the number of use and the reliability of cell is degraded.

Figure 6A:
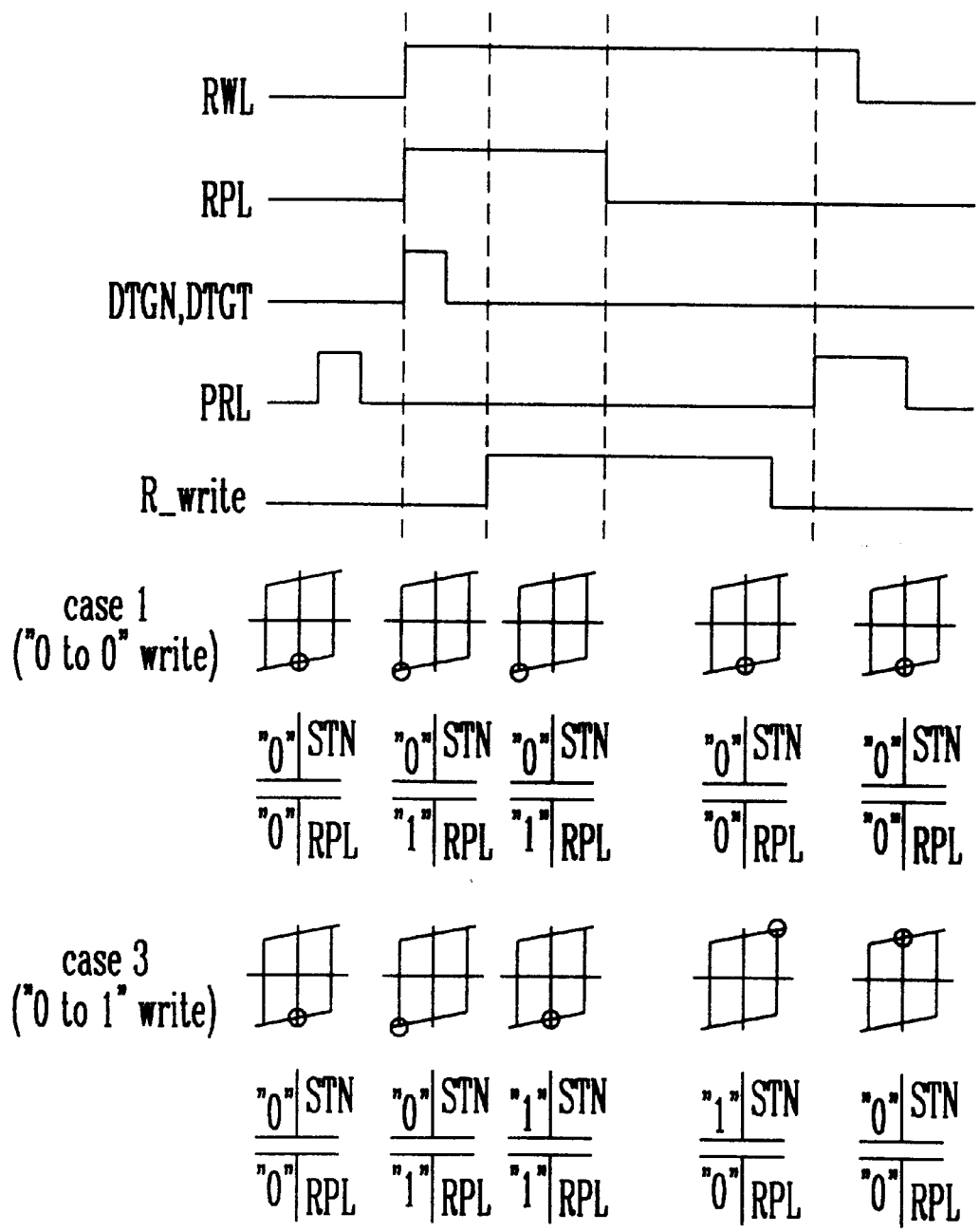

FIGS. 6A and 6B are state diagrams of hysterisis curve of reference voltage gemeraton corcuit according to the present invention. The potentials applied to the two ends of ferroelectric material are indicated below hysterisis curve, and there are two nodes of the reference plate line RPL and the storage node STN at the two ends of ferroelectric material. Here, value 0 means logic low and value 1 means logic high. In case 1 where 0 is stored in reference cell before writing and 0 is again stored, the initial polarization state is situated at point c. If, at time t1, potential of the reference word line RWL and the reference plate line RPL are transformed into a high state, the polarization state of the ferroelectric material is moved from c to b and maintains till time t3, At time t3, if potential of the reference plate line RPL is transformed into a low state, the voltages at the two ends of ferroelectric material each become 0V so that the polarization state is again moved to point c. At time t4, even if the potential of the reference word line RWL maintains a high state and potential of the precharge reference line PRL is transformed into a high state to make the potential of the reference bit line RBL 0V, the state of point c is maintained.

Next, in case 2 where 1 is stored in reference cell before writing and 1 is again stored, the initial polarization state is situated at point a. If, at time t1, potential of the reference word line RWL and the reference plate line RPL are transformed into a high state, the polarization state is moved to point b and maintains till time t2. At time t2, if the signal R_write is transformed into a high state so that high voltage is applied to the storage node STN, then the polarization state is situated at point c. Thereafter, at time t3, if potential of the reference plate line RPL is transformed into a low state and the signal R_write is maintained at high, the polarization state is moved upward to point d. At time t4, if potential of the reference bit line RBL becomes 0V by means of the signal R_wirte and potential of the reference plate line RPL, the polarization state returns to point a again and 1 is stored.

Case 3 indicates the case where 0 is stored before wirting and 1 is being written since 0 is initially stored, the initial polarization state is situated at point c. At time t1, if potential of the reference word line RWL and the reference plate line RPL is transformed into a high state, the polarization state is moved to point b and maintains till time t2. At time t2, if 1 is stored in the storage node STN by the signal R_wirte, the voltage difference between the two ends is diminished and the polarization state is again moved to point c. Thereafter, at time t3, if potential of the reference plate line RPL is transformed into a low state and the signal R_write is maintained at high, the polarization state is situated at point d. At time t4, if potential of the reference bit line RBL becomes 0V by potential of the precharge reference line PRL, the polarization state moves to point a and 1 is stored in the reference cell.

Lastly, case 4 is a case where 1 is stored as initial value in the reference cell and then 0 is written. Since the initial state is 1, the polarization state is situated at point a. At time t1, if potential of the reference word line RWL and the reference plate line RPL are transformed into a high state, the polarization state moves to point b. Thereafter, at time t2, even if the storage node STN becomes 0 by the signal R_write, since the previous potential was 0V, there is no variation in the polarization and point b is maintained. Thereafter, at time t3, if potential of the reference plate line RPL is transformed into a low state, both ends of ferroelectric material become 0V so that the polarization state moves to point c. At time t4, even if potential of the reference bit line RBL becomes 0V by potential of the precharge reference line PRL, since the voltages at both ends do not change, the polarization state does not change too so as to maintain point c.

As described above, if 0 and 1 are alternatingly written in each cell, there occur four cases. Case 1 is a case where no looping occurs, cases 3 and 4 are cases where only a half cycle interval is repeated, and case 2 is a case where the entire interval is repeated. Therefore, the excessive reduction in one cell is divided into two cells and the reduction in sensing margin is decreased. Therefore, the reduction in chip lifetime due to the reduction in sensing margin can be improved about twice.

Figure 7:
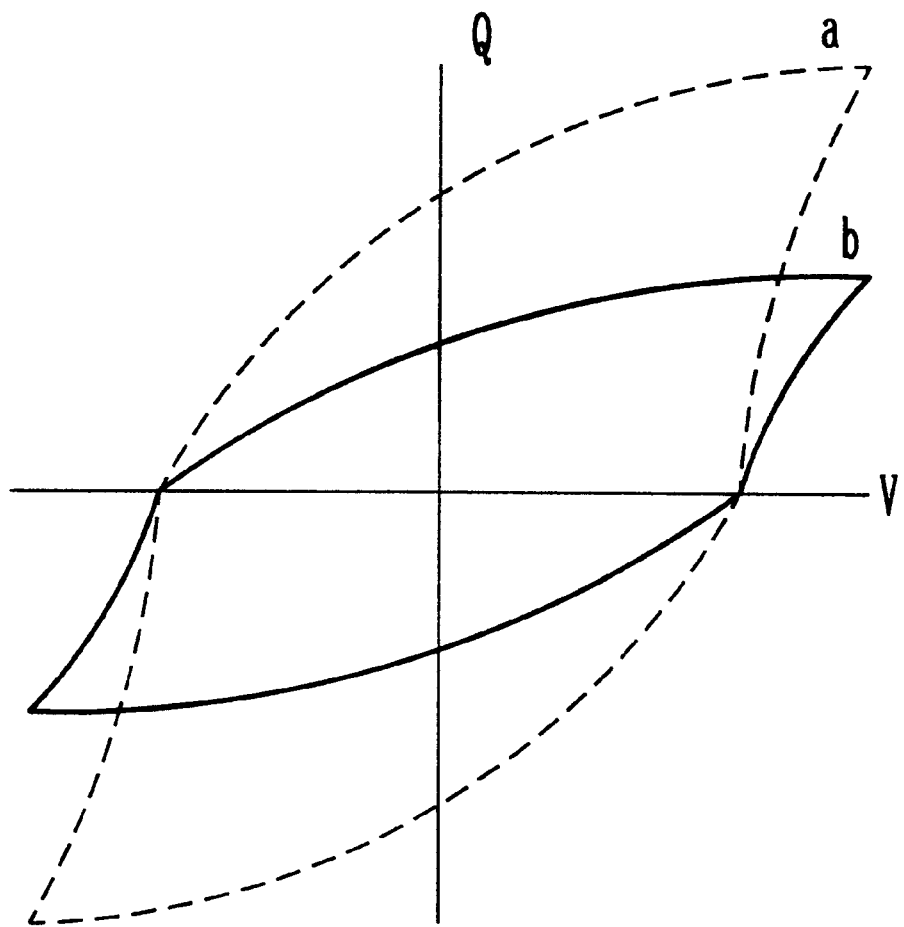
FIG. 7 is a schematic drawing of Q–V curve showing a decrease electric charge according to a number of using reference cell.

FIG. 7 is a schematic drawing of Q–V curve showing the reduction in electric charge according to the number of use. In the figures, the horizontal axis indicates the electric charge charged in the capacitor and the vertical axis indicates the voltage. The curve a indicates an initial hysterisis curve and the curve b indicates the hysterisis curve after repeated use of capacitor. As can be seen in the figures, as the number of using the ferroelectric memory device is increased, the electric charge charged in the capacitor is gradually decreased, thereby changing the voltage value.

As described above, according to the present invention, there is an excellent effect that the reduction in sensing margin due to the reduction in electric charge of reference cell can be reduced by alternatingly storing 0 and 1 in reference cell and the lifetime of reference cell is extended so as to improve the reliability of the device.

Many modifications and variations may be made in the techniques and structures described and illustrated herein without departing from the spirit and scope of the present invention. Accordingly, it should be understood that the techniques and structures described and illustrated herein are illustrative only and are not to be considered as limitations upon the scope and spirit of the present invention.

What is claimed is:

1. A ferroelectric RAM device comprising:

a cell array consisting of a plurality of memory cells between a plurality of wordlines and bit lines;

a decoder for selecting said word lines according to a plurality of addresses;

a combination circuit for generating a logical signal according to the two least significant bits of said addresses;

a reference voltage generation circuit having two reference cells which are alternately programmed according to said logical signal; and a sense amp circuit for sensing a data stored in a memory cell selected by said decoder comparing an output of said reference voltage generation circuit with said data.

2. The ferroelectric RAM device of claim 1, wherein said combination circuit comprise an Exclusive-OR gate which takes as inputs said two least significant bits of said addresses.

3. The ferroelectric RAM device of claim 2, wherein said combination circuit further comprising two inverters which are connected in series between said an output of said Exclusive-OR gate and said reference voltage generation circuit.

4. The ferroelectric RAM device comprising:

a cell array consisting of a plurality of memory cells between a plurality of word lines and bit lines;

a decoder for selecting said word lines according to a plurality of addresses;

an Exclusive-OR gate for generating a logical signal according to the two least significant bits of said addresses;

a reference voltage generation circuit having two reference cells which are alternately programmed according to said logical signal; and a sense amp circuit for sensing a data stored in a memory cell selected by said decoder comparing an output of said reference voltage generation circuit with said data.

* * * * *